(12) United States Patent
Kumamoto

(10) Patent No.: US 7,138,709 B2
(45) Date of Patent: Nov. 21, 2006

(54) MICROELECTRONIC PACKAGE ARRAY

(75) Inventor: Takashi Kumamoto, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/663,485

(22) Filed: Sep. 15, 2003

(65) Prior Publication Data

US 2004/0262729 A1 Dec. 30, 2004

Related U.S. Application Data

(63) Continuation-in-part of application No. 10/610,854, filed on Jun. 30, 2003.

(51) Int. Cl.
*H01L 23/02* (2006.01)
(52) U.S. Cl. ............... 257/686; 257/723; 257/738; 257/777
(58) Field of Classification Search .............. 257/685, 257/686, 678, 723, 734, 737, 738, 772, 777–778, 257/784; 438/106–110, 121, 613
See application file for complete search history.

(56) References Cited

U.S. PATENT DOCUMENTS

| | | | | |
|---|---|---|---|---|
| 4,327,143 A * | 4/1982 | Alvino et al. | ............... | 442/180 |
| 5,145,303 A * | 9/1992 | Clarke | ............... | 414/217 |
| 5,591,353 A * | 1/1997 | Davignon et al. | ............... | 216/18 |
| 5,840,417 A * | 11/1998 | Bolger | ............... | 428/323 |
| 5,952,440 A * | 9/1999 | Walisser et al. | ............... | 525/504 |
| 6,014,317 A * | 1/2000 | Sylvester | ............... | 257/723 |
| 6,054,337 A * | 4/2000 | Solberg | ............... | 438/107 |
| 6,468,831 B1 * | 10/2002 | Leong et al. | ............... | 438/108 |
| 6,501,165 B1 * | 12/2002 | Farnworth et al. | ............... | 257/686 |
| 6,507,102 B1 * | 1/2003 | Juskey et al. | ............... | 257/706 |
| 6,564,454 B1 * | 5/2003 | Glenn et al. | ............... | 29/852 |
| 6,828,665 B1 * | 12/2004 | Pu et al. | ............... | 257/686 |
| 6,878,571 B1 * | 4/2005 | Isaak et al. | ............... | 438/107 |
| 2001/0054758 A1 * | 12/2001 | Isaak | ............... | 257/686 |
| 2002/0066952 A1 | 6/2002 | Taniguchi et al. | | |
| 2002/0135057 A1 * | 9/2002 | Kurita | ............... | 257/685 |

* cited by examiner

*Primary Examiner*—Ori Nadav
(74) *Attorney, Agent, or Firm*—Schwabe, Williamson & Wyatt, P.C.

(57) ABSTRACT

This invention relates to an apparatus and method for increasing microelectronic package density by stacking multiple microelectronic packages in an array and controlling package to package scalability without stressing the carrier substrates and without limiting the number of signal and input/output leads. Specifically, an intermediate substrate having conductive risers therein is used to enable pitch control of the package to package interconnection, control of the standoff distance and act as a microelectronic package stiffener.

23 Claims, 4 Drawing Sheets

MICROELECTRONIC PACKAGE ARRAY

RELATED APPLICATIONS

This application is a continuation in part of U.S. patent application Ser. No. 10/610,854, filed on Jun. 30, 2003.

FIELD OF THE INVENTION

The present invention relates to microelectronic packaging, and more particularly to increasing package stiffness to enable stacking of multiple microelectronic packages without unnecessarily increasing substrate thickness.

BACKGROUND

Trends in microelectronic devices are toward increasing miniaturization, circuit density, operating speeds and switching rates. These trends directly impact the complexity associated with the design and manufacture of microelectronic packages, which may include dice, carrier substrates and the like, as well as computing devices in general. Examples of computing devices include, but are not limited to servers, personal computers and "special" purpose computing devices. Personal computers may have form factors, such as desktop, laptop, tablet, and the like. "Special" purpose computing devices may include set top boxes, personal digital assistants, wireless phones, and the like.

In particular, attention has increasingly shifted to microelectronic packaging as a way to help meet the demands for enhanced system performance. As demand increases, it has become necessary to use multiple dice and or microelectronic packages that work in conjunction with one another. When using multiple dice or microelectronic packages, however, it becomes critical to position the dice close together since excessive signal transmission distance may deteriorate signal integrity and propagation times. The use of conventional single-die microelectronic packages, however, is not commensurate with the need to shorten signal transmission distance because they typically have an area (or footprint) many times larger than the area of the die. This not only increases transmission distances, but it also decreases packaging density.

One solution to create higher density packaging, reduce area requirements and shorten signal transmission distances has been to vertically stack microelectronic packages, such as ball grid arrays (BGA) and chip scale packages (CSP), in an array. Although these stacked microelectronic packages provide certain advantages, further size reduction and performance enhancement has been difficult to obtain due to the physical dimension, design and manufacturing constraints of the individual microelectronic packages and the interconnection to the other microelectronic packages in the array.

A number of problems exist with stacking microelectronic packages. One problem, for example, is that carrier substrates may warp or flex during manufacturing or under certain operating conditions due to factors such as heat, pressure and weight. Flexing and sag are undesirable because it can result in open connections and reduce solder ball co-planarity, which makes it more difficult to couple microelectronic packages together, electrically and mechanically. These problems can result in microelectronic package failure or significantly reduce effectiveness and performance.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

<Beginning of Parent Text> In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
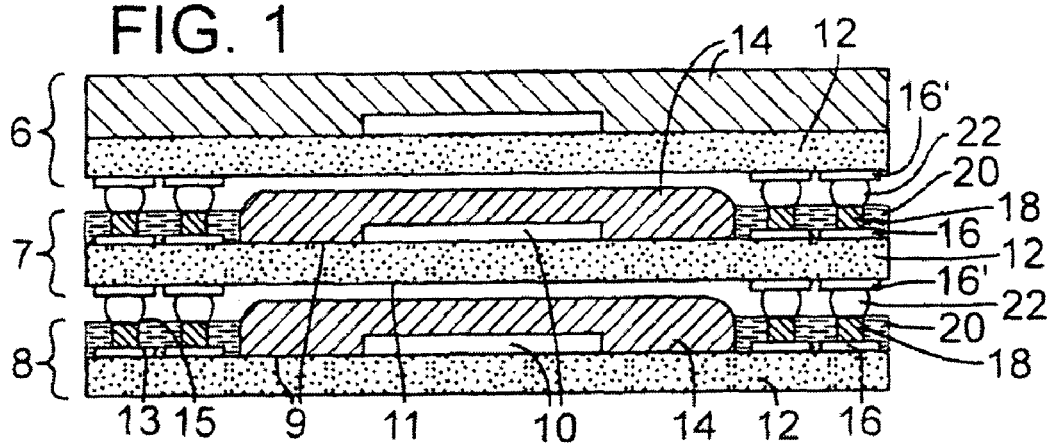
FIG. 1 is a side cross-sectional view of an array of microelectronic packages in accordance with one embodiment of the present invention.

FIG. 1 is a side cross sectional view of an array of a microelectronic packages in accordance with an embodiment of the present invention. First microelectronic package 8 comprises a microelectronic die 10 electrically interconnected with a carrier substrate 12. Die 10 is encased in an encapsulation material 14, a common practice in the art. It can be appreciated by one skilled in the art, however, that encapsulation material 14 is provided for a particular purpose, and in other embodiments is not required or provided (i.e. optional). Suitable encapsulation materials include, but are not limited to, molded plastic, resins and epoxies.

Carrier substrate 12 of first microelectronic package 8 has land pads 16 exposed at a die side 9 of carrier substrate 12, outside the periphery of the die 10 and encapsulation material 14. It is understood in the art that the terms "land pads" and "bond pads" are terms for referring to pads, plated through holes, or any other structure that allows for electrical communication between the carrier substrate circuitry and an attached component.

Intermediate substrate 20 can be mechanically coupled or laminated to the carrier substrate 12, such that it may encompass the periphery of die 10 and encapsulation material 14. Intermediate substrate 20 comprises a variety of dielectric materials, including but not limited to C-stage thermoset polymer resins, epoxies, and the like. In other embodiments that do not include encapsulation material 14, the intermediate substrate 20 can encompass the periphery of die 10, or it may have a cavity that is sized to accommodate the die volume such that it covers die 10.

Intermediate substrate 20 has a plurality of conductive risers 18 disposed therein. Conductive risers 18 have a first end 13 and a second end 15, and are in relative alignment such that the first end 13 may be in electrical communication with land pads 16 of carrier substrate 12. The second end 15 of conductive risers 18 are also positioned to enable electrical interconnection with bond pads 16' of adjacent second microelectronic package 7. Conductive risers 18 may reduce the size of interconnects 22 needed for electrical interconnection, which may allow for a finer pitch in land pads 16 and bond pads 16'. Conductive risers 18 comprise a variety of conductive materials, including, but not limited to, copper, gold, nickel, and various other metals and metal alloys.

Second microelectronic package 7 can be positioned adjacent to microelectronic package 8. Microelectronic package 7 may be substantially the same as first microelectronic package 8, and comprises a microelectronic die 10 encased in encapsulation material 14 that is electrically interconnected to a carrier substrate 12. Carrier substrate 12 of second microelectronic package 7 further comprises land pads 16 on the die side 9 and bond pads 16' on the non-die side 11.

Bond pads 16' are positioned for relative alignment and electrical interconnection with the second end 15 of conductive risers 18 disposed in the intermediate substrate 20 of the first microelectronic package 8. Interconnects 22 electrically interconnect conductive risers 18 with bond pads 16'. Interconnects 22 comprise a conductive material including, but not limited to, leaded solder, lead-free solder, conductive or conductor-filled epoxy, and other conductive substances known to those skilled in the art. Second microelectronic package 7 may also comprise an intermediate substrate 20, having conductive risers 18 disposed therein, in much the same way as discussed above with regard to the intermediate substrate 20 for first microelectronic package 8.

Third microelectronic package 6 may be positioned adjacent to second microelectronic package 7. Microelectronic package 6 also is substantially the same as first microelectronic package 8, and comprises a microelectronic die 10 encased in encapsulation material 14 that is electrically interconnected to a carrier substrate 12. Carrier substrate 12 of third microelectronic package 6 comprises bond pads 16' on the non-die side 11 of carrier substrate 12. Bond pads 16' of third microelectronic package 6 are positioned for relative alignment and electrical interconnection with the conductive risers 18 of the intermediate substrate 20 of second microelectronic package 7. Interconnects 22 electrically interconnect conductive risers 18 with bond pads 16' of the third microelectronic package 6.

In addition to the stacked array of three microelectronic packages 8, 7, 6, as illustrated in FIG. 1, other embodiments of stacked arrays in accordance with the present invention may have more or fewer microelectronic packages in the array. Additionally, the use of the conductive risers 18 may also allow for fine pitch package-to-package interconnection scalability because the height required to clear the adjacent microelectronic package is no longer constrained by interconnects 22, but rather may be dependent on the height and width of the conductive risers 18.

Figure 2:
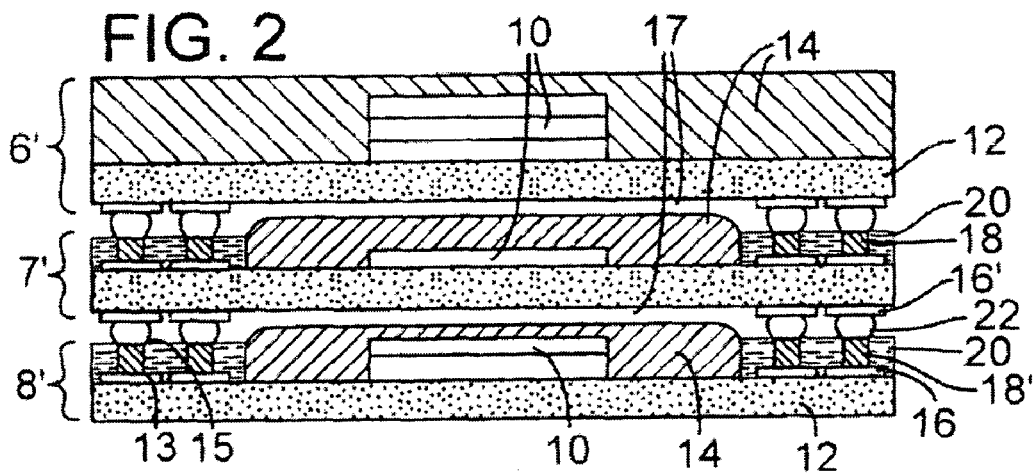
FIG. 2 is a side cross-sectional view of an array of microelectronic packages in accordance with another embodiment of the present invention.

FIG. 2 is a side cross sectional view of an array of microelectronic packages in accordance with an embodiment of the present invention. The stacked array comprises multiple microelectronic packages each having one or more stacked microelectronic dice. First microelectronic package 8' has many of the same elements as first microelectronic package 8 as described with respect to FIG. 1. The conductive risers 18' of first microelectronic package 8', however, are slightly elongated in order to accommodate increased package height caused by the additional microelectronic dice 10. The elongated conductive risers 18' then may help to maintain the package to package scalability without increasing the pitch of the land pads 16 or bond pads 16'. Likewise, the conductive risers 18 of second microelectronic package 7' can be adapted to provide a predetermined standoff height for the third microelectronic package 6', again without affecting package to package scalability.

The gap height 17 between microelectronic packages may be adjusted using different heights of conductive risers for a variety of reasons, including but not limited to accommodate varying microelectronic package thickness. Adjustment to the gap height may also help accommodate additional components such as heat spreaders (not shown), provide a required standoff distance, or increase the pitch of the microelectronic packages without increasing the interconnect 22.

Figure 3A:
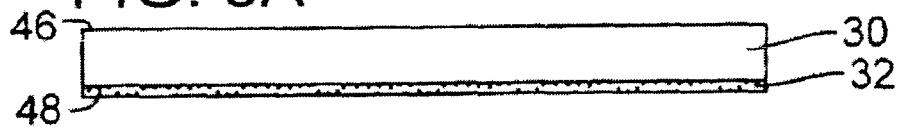
FIGS. 3A–3C are side cross-sectional views showing a process for manufacturing a microelectronic package in accordance with one embodiment of the present invention.
Figure 3B:
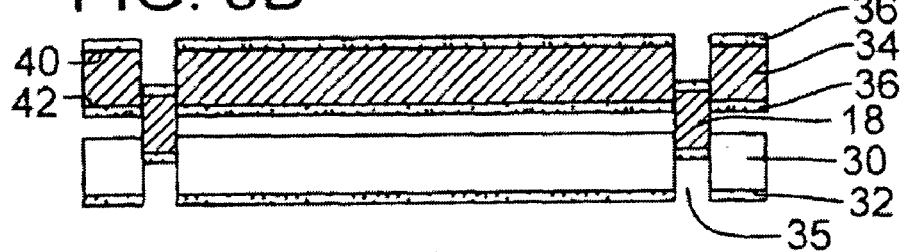
Figure 3C:
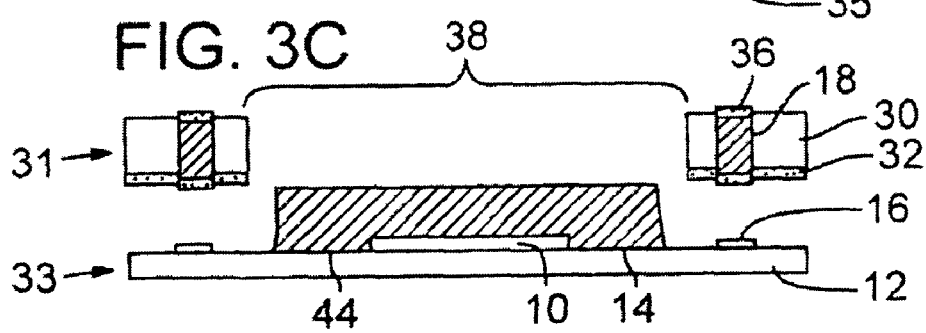
Figure 4:
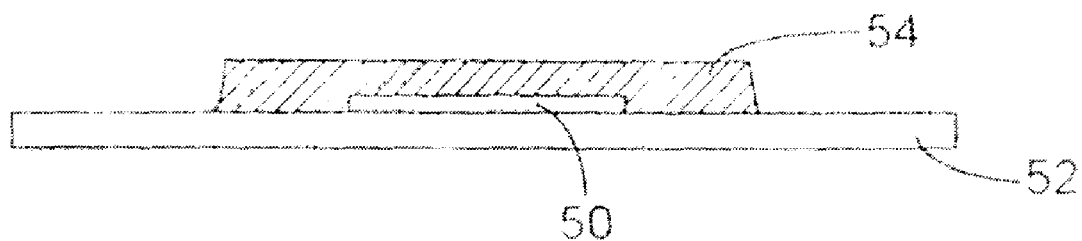
FIG. 4 is a side cross sectional view of a known singe-die microelectronic package.
Figure 5:
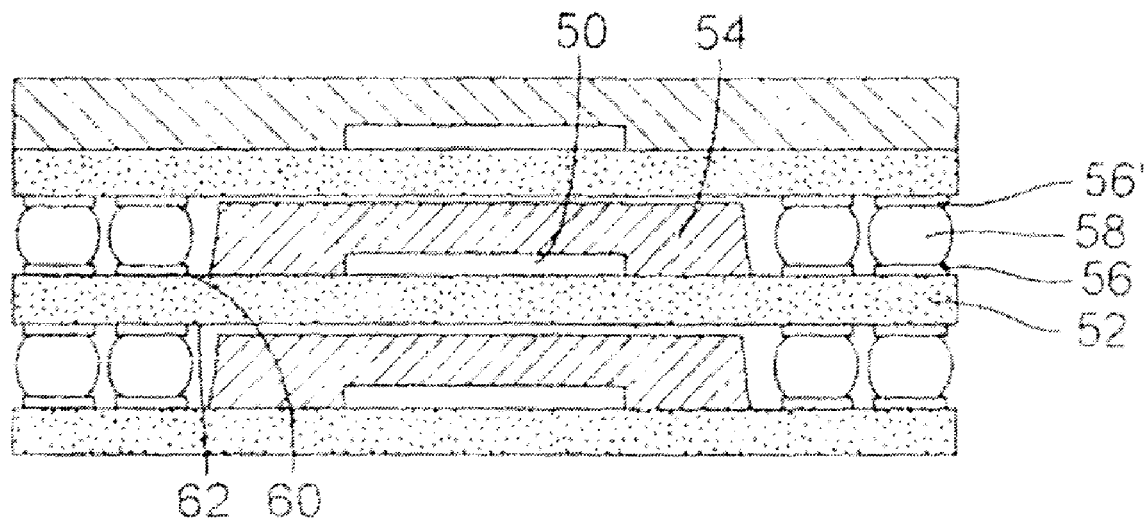
FIG. 5 is a side cross sectional view of a known array of microelectronic packages.

FIGS. 3A–3C are side cross-sectional views showing a process for manufacturing a microelectronic package in accordance with one embodiment of the present invention. FIG. 3A illustrates an intermediate substrate blank 30 of a predetermined size that has a first side 46 and a second side 48. Adhesive layer 32 can be applied to the second side 48 of intermediate substrate blank 30, which enables the intermediate substrate to couple to the carrier substrate. Adhesive layer 32 may also be applied to the first side 46 of substrate blank 30 to enable the intermediate substrate to be mechanically coupled to the carrier substrate of an adjacent microelectronic package.

Intermediate substrate blank 30 can be made out of variety of dielectric materials. As previously discussed with regard to intermediate substrate 20 in FIG. 1, one example is the use of a C-stage thermoset polymer resin for intermediate substrate 30 and a B-stage thermoset polymer resin for adhesive layer 32. Use of C-stage and B-stage resins are known in the art and can be done in a variety of ways (further discussed below).

FIG. 3B is a cross sectional view of the manufacturing process, where the conductive riser 18 may be inserted into an accommodating aperture 35 in substrate blank 30, in accordance with one embodiment. Conductive material 34, having a predetermined thickness, comprises a conductive plating 36 applied to the first end 40 and second end 42 of conductive material 34. Conductive plating 36 enables electrical interconnection with land pads 16 of carrier substrate 12 (shown in FIG. 3C) and bond pads 16' (not shown) of an adjacent microelectronic package. Suitable materials for conductive plating 36 include, but are not limited to, electrolytic tin plating, lead and lead-free solder.

Conductive riser 18 can be removed from conductive material 34 using, for example, a punch and die process. Aperture 35 in intermediate substrate blank 30 can be formed by a similar process. As conductive riser 18 is being punched out of conductive material 34, it can be accordingly pressed into aperture 35. Conductive riser 18 and aperture 35 may be created by other techniques, including but not limited to, drilling, augering, laser etching or inserting the conductive material 34 into aperture 35 in a non-solid phase and curing to a solid phase The overall thickness of the conductive material 34 and the conductive plating 36 may be the same as or greater than the thickness of the intermediate substrate blank 30, including adhesive layer 32, such that a portion of the conductive plating 36 is flush with or protrudes slightly above the surfaces of the intermediate substrate blank 30 and adhesive layer 32, when inserted in aperture 35. A slight protrusion allows the conductive riser 18 to electrically interconnect with land pads 16 and bond pads 16' (not shown) when the intermediate substrate 30 is secured to a carrier substrate during, for example, a hot press process or during a reflow process. In other embodiments, conductive risers 18 are formed from a conductive material 34 without conductive plating 36. Interconnect (not shown) can also be pre-positioned on the ends of the conductive risers, land pads and/or bond pads such that electrical interconnection is made during a reflow process or the hot press process.

FIG. 3C is a cross-sectional view of an intermediate substrate fabrication process in accordance with an embodiment of the present invention. Second aperture 38 may be formed in intermediate substrate blank 30, which in turn may complete the formation of the intermediate substrate 31. Second aperture 38 enables intermediate substrate 31 to over lay carrier substrate 12, accommodating the size and shape of the die 10 and, optionally encapsulation material 14. Intermediate substrate 31 may be placed on the die side 44 of carrier substrate 12 of microelectronic package 33, such that the conductive plating 36 of the conductive risers 18 are in electrical communication with corresponding land pads 16. <End of Parent Text>

<Beginning of CIP Material> The intermediate substrate may be mechanically coupled to either carrier substrate, or both, such that it may act as a stiffener to increase the rigidity of a microelectronic package and/or the microelectronic package array. Stiffening the microelectronic package/array may help prevent flex and/or sag in the intermediate substrate, thereby reducing the potential for open circuits leading to flex-induced interconnect failure.

Figure 7:
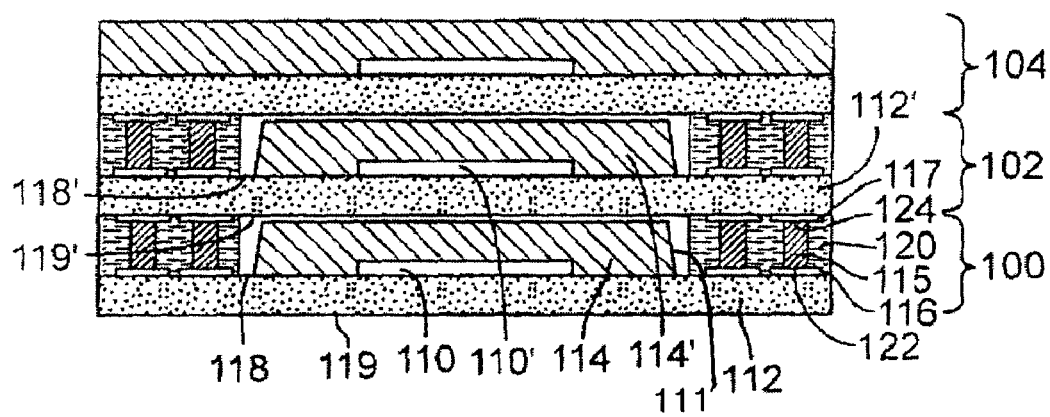
FIG. 7 illustrates a cross-sectional view of an array of microelectronic packages in accordance with an embodiment of the present invention.

FIG. 7 illustrates a cross-sectional view of an array of microelectronic packages in accordance with another embodiment of the present invention. First microelectronic package 100 includes a first carrier substrate 112 having a die side 118 and a non-die side 119. A die 110 is coupled to die side 118. Die 110 is covered with encapsulation material 114, though encapsulation material 114 is not required. The encapsulation material 114 having a form factor with a peripheral surface 111 opposite of the die 110 that intersects the die side 118 of the carrier substrate 112. Land pads 116 are positioned at or near the die side 118 of carrier substrate 112.

Second microelectronic package 102 includes a second carrier substrate 112' having a die side 118' and a non-die side 119'. A die 110' is coupled to die side 118'. Die 110' is covered with encapsulation material 114', though it can be appreciated that encapsulation material 114' is not required. Bond pads 117 are positioned at or near the non-die side 119' of carrier substrate 112'.

Intermediate substrate 120 may be disposed between the die side 118 of the first carrier substrate 112 and the non-die side 119' of the second carrier substrate 112' and located external to the peripheral surface 111 of the encapsulation material 114. Conductive risers 115 may be disposed within intermediate substrate 120. The conductive risers 115 may have a first end 122 and a second end 124. The conductive risers may be positioned such that the first ends may electrically couple with the land pads 116 and the second ends may electrically couple with a corresponding bond pads 117 of the adjacent carrier substrate 112'.

Intermediate substrate 120 may be mechanically coupled to first carrier substrate 112 and to the second carrier substrate 112', while the conductive risers 115 may be electrically coupled to the land pads 116 of carrier substrate 112 and the bond pads 117. By doing so, the individual packages 100 and 102, as well as the microelectronic package array may become more rigid with respect to each other, such that the array and individual microelectronic packages better resists flexing and warpage. Thus, interconnect, for example solder balls, is not needed in conjunction with the intermediate substrate and conductive risers to control standoff height, as discussed with regard to the embodiments in FIGS. 1 and 2.

Intermediate substrate 120 can be mechanically coupled to the first and second carrier substrates 112, 112' in a variety of ways, including, but not limited to using B-stage polymers, temperature sensitive adhesives, mechanical fasteners and the like. It can be appreciated that multiple microelectronic packages can continue to be stacked in the array. For brevity, FIG. 7 shows one more microelectronic package 104 mechanically and electrically coupled to an intermediate substrate placed on the die side of microelectronic package 102

Figure 8:
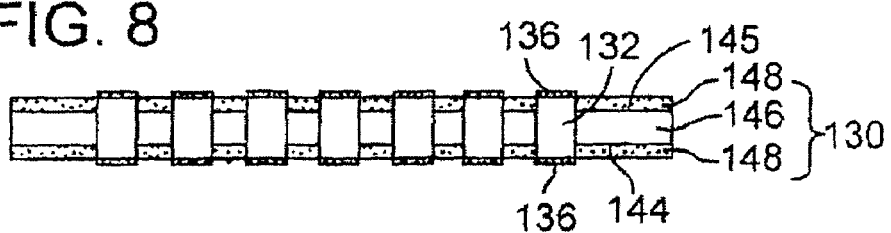
FIG. 8 illustrates a cross-sectional view of an intermediate substrate in accordance with an embodiment of the present invention.

FIG. 8 illustrates an intermediate substrate 130 in accordance with one embodiment of the present invention. Intermediate substrate 130 may consist of a core 146 having a first side 144 and a second side 145. Core 146 may be made of a C-stage resin, as further described below, or any other material that provides rigidity and does not sag or flex at the maximum processing temperatures. Adhesive layers 148 can be disposed about the first side 144 and second side 145 of the core 146. Adhesive layers 148 may be a B-stage polymer, which when subjected to a suitable process, may mechanically couple the first side 144 of core 146 to the die side of a first carrier substrate and the second side 145 of core 146 to the non-die side of a second carrier substrate (not shown).

Conductive plating 136 is positioned on the first and second ends of the conductive risers 132. When mechanically coupling the intermediate substrate to adjacent carrier substrates, the conductive risers may be electrically coupled to corresponding land pads and bond pads (not shown) through conductive plating 136.

The process used to couple the intermediate substrate 130 to a carrier substrate depends on the material used for the adhesive layer 148. In one embodiment, where the core is a C-stage polymer resin and the adhesive layer is a B-stage polymer, a hot press process may be used to mechanically and electrically couple the intermediate substrate to either one or both adjacent carrier substrates. Generally, heat and pressure are applied to the microelectronic packages such that the B-stage polymer and the conductive plating flows and then cures to help ensure an electrical/mechanical bond between the carrier substrates and the intermediate substrate is created. Where the intermediate substrate is only being mechanically coupled to one carrier substrate, and an interconnect (e.g. solder balls) is being used to electrically interconnect the conductive risers to the adjacent microelectronic package (as discussed with respect to FIGS. 1 and 2), the hot press process may also cause the interconnect to flow and cure thereby creating a elecro-mechanical bond.<End of CIP>

<Parent Text> In one embodiment of a hot press process, where a C-Stage resin for the core of the intermediate substrate and a B-stage resin for adhesive layer are used, a vacuum can be applied such that the pressure within the chamber is less than about 10 kilo Pascals. Heat and pressure may be applied to mechanically couple carrier substrate and intermediate substrate, as well as electrically/mechanically couple land and bond pads to the corresponding conductive risers disposed in the intermediate substrate. Applying a pressure about between 0.5–10 mega Pascals at a temperature about between 150–350 degrees Celsius may provide acceptable lamination of the intermediate substrate to the carrier substrate. Further, this may help ensure electrical coupling between land and bond pads and the conductive risers. The pressure and temperature of the hot press may be varied depending on the properties of the adhesive layer, conductive plating and, if used, interconnect.

The intermediate substrate material selected may be application dependent, such as to provide a predetermined material stiffness, and/or control the coefficient of thermal expansion (CTE). Thus, other suitable dielectric materials can be used for the intermediate substrate core, including but not limited to various polymer matrix composites. Further, the stiffness of the intermediate substrate can be increased by adding materials to the core material, such as fiberglass cloth, non woven fabric, composite fibers, and the like.

Figure 6:
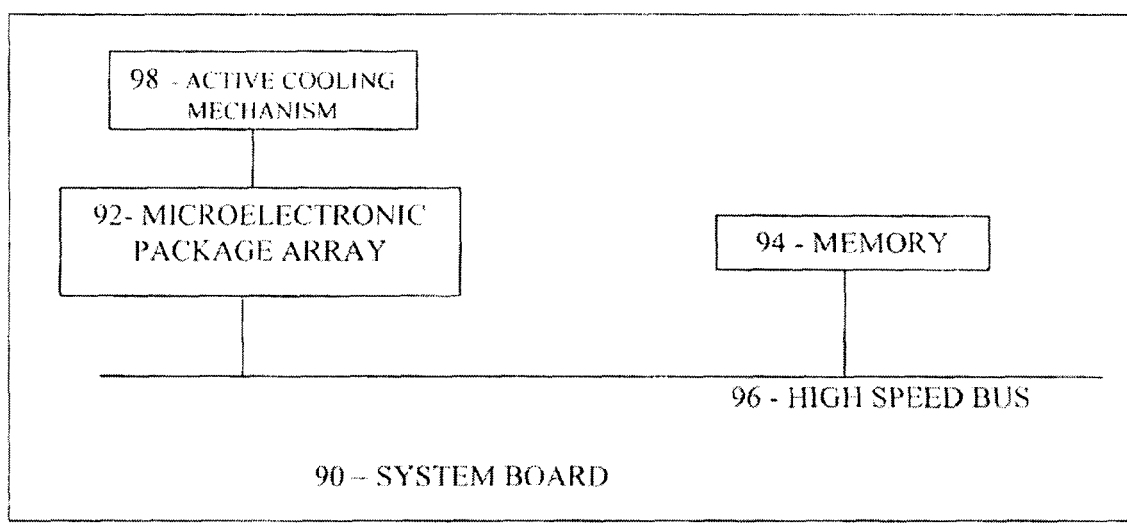
FIG. 6 is an example system suitable for practicing the present invention in accordance with one embodiment.

FIG. 6 is an example system suitable for practicing one embodiment of the present invention. A microelectronic package array 92 in accordance with the present invention is coupled to system board 90 through high-speed bus 96. System board 90 may be a carrier substrate, such as a motherboard or other printed circuit boards. As shown, the system board 90 also includes a memory 94 configured to store data, coupled to the system board 90 through high speed bus 96. Memory 94 may include but is not limited to dynamic random access memory (DRAM), synchronous DRAM (SDRAM), and the like. In the embodiment shown, an active cooling mechanism 98 is coupled to the microelectronic package array 92 to help keep the microelectronic package 92 from overheating. Active cooling mechanism may include, but is not limited to fans, blowers, liquid cooling loops and the like.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A microelectronic package array, comprising:
a first microelectronic package including a first carrier substrate having a first die side and a first non-die side, a first die electrically coupled to the first die side, and a land pad on the first die side;
an encapsulation material encasing the first die, the encapsulation material having a form factor with a peripheral surface opposite of the die that intersects the first die side of the first carrier substrate;
a second microelectronic package comprising a second carrier substrate having a second die side and a second non-die side, a second die electrically coupled to the second die side, and a bond pad on the second non-die side; and
an intermediate substrate having a first side and a second side, the first side being directly coupled to the first die side of the first carrier substrate and located external of the peripheral surface of the encapsulation material, the second side being directly coupled to the second non-die side of the second carrier substrate, the intermediate substrate comprising of a substantially solid core having a first side and a second side, the substantially solid core comprising of a C-stage resin reinforced with a matrix to increase rigidity of the microelectronic packages and control the coefficient of thermal expansion of the intermediate substrate.

2. The microelectronic package array of claim 1, wherein the intermediate substrate further comprises
an adhesive material disposed on the first side and second side of the core; and
a conductive riser disposed within the solid core.

3. The microelectronic package array of claim 2, wherein the intermediate substrate is mechanically bonded to the first die side of the first carrier substrate and the second non-die side of the second carrier substrate by the adhesive material.

4. The microelectronic package array of claim 3, wherein the adhesive material is a B-stage polymer.

5. The microelectronic package array of claim 1, wherein the matrix is selected from a group including fiberglass cloth, composite fiber and non-woven fabric.

6. The microelectronic package array of claim 2, wherein the conductive riser is electrically coupled to the land pad of the first microelectronic package and the bond pad of the second microelectronic package.

7. The microelectronic package array of claim 6, wherein the conductive riser includes a first end and a second end having conductive plating disposed thereon, the first and second ends being electrically bonded to the land pad and the bond pad respectively by the conductive plating.

8. The microelectronic package array of claim 7, wherein conductive plating is selected from a group including leaded solder, lead-free solder and tin.

9. A system, comprising:
a system board;
a bus disposed on the system board to facilitate data exchange;
a memory configured to store data, the memory disposed on the system board and coupled to the bus;
a microelectronic package array disposed on the system board and coupled to the bus, the microelectronic package array comprising:
a first microelectronic package including a first carrier substrate having a first die side and a first non-die side, a first die electrically coupled to the first die side, and a land pad on the first die side;
an encapsulation material encasing the first die, the encapsulation material provided having a form factor with a peripheral surface opposite of the die that intersects the first die side of the first carrier substrate;
a second microelectronic package comprising a second carrier substrate having a second die side and a second non-die side, a second die electrically coupled to the second die side, and a bond pad on the second non-die side; and
an intermediate substrate directly coupled to the first die side of the first carrier substrate and the second non-die side of the second carrier substrate, the intermediate substrate located external of the peripheral surface of the encapsulation material and comprising of a substantially solid core having a first side and a second side, the substantially solid core comprising of C-stage resin reinforced with a matrix to increase rigidity of the microelectronic packages and control the coefficient of thermal expansion of the intermediate substrate.

10. The system of claim 9, wherein the intermediate substrate further comprises
an adhesive material disposed on the first side and second side of the core; and
a conductive riser disposed within the solid core.

11. The system of claim 10, wherein the intermediate substrate is mechanically bonded to the first die side of the first carrier substrate and the second non-die side of the second carrier substrate by the adhesive material.

12. The system of claim 11, wherein the adhesive material is a B-stage polymer.

13. The system of claim 9, wherein the matrix is selected from a group including fiberglass cloth, glass fiber carbon fiber and non-woven fabric.

14. The system of claim 10, wherein the conductive riser is electrically coupled to the land pad of the first microelectronic package and the bond pad of the second microelectronic package.

15. The system of claim 14, wherein the conductive riser includes a first end and a second end having conductive plating disposed thereon, the first and second ends being electrically bonded to the land pad and the bond pad respectively by the conductive plating.

16. The system of claim 15, wherein conductive plating is selected from a group including leaded solder, lead-free solder and tin.

17. A method for fabricating a microelectronic package array, comprising:
providing a first microelectronic package having a first carrier substrate with a first die side and a first non-die side, and a plurality of land pads disposed on the first die side, and a die electrically coupled to the first die side;
encasing the die with an encapsulation material, the encasing encapsulation material having a form factor with a peripheral surface opposite of the die that intersects the first die side of the first carrier substrate;
providing a second microelectronic package having a second carrier substrate with a second die side and a second non-die side, and a plurality of bond pads disposed on the second non-die side;
placing an intermediate substrate having a plurality of conductive risers disposed therein directly on the first die side of the first carrier substrate and external of the peripheral surface of the encapsulation material, the intermediate substrate comprising of a substantially solid core having a first side and a second side, the substantially solid core comprising of a C-stage resin reinforced with a matrix to increase stiffness and control the coefficient of thermal expansion of the intermediate substrate;
placing the second carrier substrate directly on the intermediate substrate with the second non-die side coming in direct contact with the intermediate substrate;
mechanically coupling the intermediate substrate to the first and second carrier substrates; and
electrically coupling the plurality of conductive risers with the plurality of land and bond pads.

18. The method of claim 17, wherein the method further comprises:
placing the microelectronic package array in a vacuum chamber;
creating a vacuum in the vacuum chamber;
applying heat to the microelectronic package array;
applying pressure to the microelectronic package array;
releasing the pressure; and
cooling the microelectronic package array.

19. The method of claim 18, wherein creating a vacuum comprises establishing a pressure of about less than ten kilo Pascals.

20. The method of claim 18, wherein applying heat comprises raising the temperature to about between 150° C. and 350° C.

21. The method of claim 18, wherein applying a pressure comprises increasing the pressure to a range between 0.5 mega Pascals and 10 mega Pascals.

22. The method of claim 17, wherein an adhesive material is disposed on the first side and the second side of the intermediate substrate.

23. The method of claim 22, wherein the adhesive material is a B-stage polymer.

* * * * *

UNITED STATES PATENT AND TRADEMARK OFFICE
CERTIFICATE OF CORRECTION

PATENT NO. : 7,138,709 B2 Page 1 of 1
APPLICATION NO. : 10/663485
DATED : November 21, 2006
INVENTOR(S) : Takashi Kumamoto It is certified that error appears in the above-identified patent and that said Letters Patent is hereby corrected as shown below:

Column 4
Lines 32-33, "..intermediate substrate 30…" should read --…intermediate substrate blank 30…--.

Line 39, "…substrate blank 30,…" should read --…intermediate substrate blank 30,…--.

Column 5
Line 1, "…intermediate substrate 30…" should read --…intermediate substrate blank 30…--.

Lines 14-15, "…to over lay…" should read --…to overlay…--.

Lines 61-62, "…second carrier substrate 112,…" should read --…second carrier substrate 112',…--.

Column 6
Line 15, "…102" should read --…102.--.

Column 7
Lines 26-27, "…microelectronic package 92…" should read --…microelectronic package array 92…--.

Signed and Sealed this

Twenty-seventh Day of May, 2008

JON W. DUDAS
*Director of the United States Patent and Trademark Office*